US009069265B2

(12) United States Patent
de Boer et al.

(10) Patent No.: US 9,069,265 B2
(45) Date of Patent: Jun. 30, 2015

(54) INTERFEROMETER MODULE

(75) Inventors: Guido de Boer, Leerdam (NL); Thomas Adrian Ooms, Delfgauw (NL); Niels Vergeer, Rotterdam (NL); Godefridus Cornelius Antonius Couweleers, Delft (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 340 days.

(21) Appl. No.: 13/436,738

(22) Filed: Mar. 30, 2012

(65) Prior Publication Data

US 2012/0250026 A1 Oct. 4, 2012

(30) Foreign Application Priority Data

Mar. 30, 2011 (NL) ...................................... 2006496

(51) Int. Cl.
*G01B 9/02* (2006.01)
*G03F 7/20* (2006.01)

(52) U.S. Cl.
CPC ........ *G03F 7/70775* (2013.01); *G03F 7/70833* (2013.01); *G03F 7/7085* (2013.01); *H01J 2237/30438* (2013.01)

(58) Field of Classification Search
CPC ........... G01B 2290/70; G01B 9/02019; G01B 9/02016; G01B 9/02; G01D 5/35383; G01J 2009/0261; G03F 7/70775; H01J 2237/31728
USPC .......................................................... 356/493
See application file for complete search history.

(56) References Cited

U.S. PATENT DOCUMENTS

| 4,504,147 | A | | 3/1985 | Huang |
| 5,719,702 | A | | 2/1998 | Decker |
| 5,745,242 | A | | 4/1998 | Hata |
| 5,880,838 | A | * | 3/1999 | Marx et al. .................... 356/498 |
| 6,020,963 | A | | 2/2000 | DiMarzio |

(Continued)

FOREIGN PATENT DOCUMENTS

| DE | 102004023030 A | 12/2005 |
| EP | 1174679 A2 | 1/2002 |

(Continued)

OTHER PUBLICATIONS

Harris, et al. "Stage Position Measurement for e-beam Lithography Tool." Proc. SPIE 6517, Emerging Lithographic Technologies XI, 651710 (Mar. 15, 2007). 10 pages.

(Continued)

*Primary Examiner* — Tarfur Chowdhury
*Assistant Examiner* — Jonathon Cook
(74) *Attorney, Agent, or Firm* — Blakely Sokoloff Taylor & Zafman

(57) ABSTRACT

The invention relates to a differential interferometer module adapted for measuring a direction of displacement between a reference mirror and a measurement mirror. In an embodiment the differential interferometer module is adapted for emitting three reference beams towards a first mirror and three measurement beams towards a second mirror for determining a displacement between said first and second mirror. In a preferred embodiment the same module is adapted for measuring a relative rotation around two perpendicular axes as well. The present invention further relates to a lithography system comprising such a interferometer module and a method for measuring such a displacement and rotations.

25 Claims, 15 Drawing Sheets

(56) References Cited

U.S. PATENT DOCUMENTS

| | | | |
|---|---|---|---|
| 6,122,036 | A | 9/2000 | Yamasaki et al. |
| 6,266,130 | B1 | 7/2001 | Hasegawa et al. |
| 6,331,885 | B1 | 12/2001 | Nishi |
| 6,486,955 | B1 | 11/2002 | Nishi |
| 6,507,326 | B2 | 1/2003 | Manabe et al. |
| 6,563,573 | B1 | 5/2003 | Morohoshi et al. |
| 7,224,466 | B2 | 5/2007 | Ray |
| 7,298,492 | B2 * | 11/2007 | Tixier ............. 356/491 |
| 7,397,570 | B2 * | 7/2008 | Kawasaki et al. ............. 356/512 |
| 7,413,310 | B2 | 8/2008 | Heine |
| 7,528,960 | B2 * | 5/2009 | Boesser et al. ............. 356/500 |
| 8,462,349 | B1 * | 6/2013 | Rhoadarmer et al. ......... 356/491 |
| 2003/0007158 | A1 * | 1/2003 | Hill ............. 356/493 |
| 2005/0105855 | A1 | 5/2005 | Dressler |
| 2005/0225770 | A1 | 10/2005 | Chapman et al. |
| 2007/0229841 | A1 | 10/2007 | Feldman |
| 2008/0198386 | A1 * | 8/2008 | Hirata et al. ............. 356/491 |
| 2009/0135430 | A1 * | 5/2009 | Zhu ............. 356/487 |

FOREIGN PATENT DOCUMENTS

| | | | |
|---|---|---|---|
| EP | 0956518 | B1 | 1/2004 |
| EP | 0999475 | B1 | 1/2008 |
| JP | 1184402 | | 7/1989 |
| JP | 07253303 | | 10/1995 |
| JP | 2005057222 | | 3/2005 |
| JP | 2006170796 | | 6/2006 |
| WO | WO03033199 | A1 | 4/2003 |
| WO | 03067334 | A | 8/2003 |

OTHER PUBLICATIONS

Magnan, Pierre. "Detection of Visible Photons in CCD and CMOS: A Comparative View." Nuclear Instruments and Methods in Physics Research A 504 (2003), p. 199-212. 14 pages.

"RLD10 DI (Differential Interferometer) Detector Head." L-9904-2351-04-A Data Sheet, Renishaw (2010). www.renishaw.com. 2 pages.

Chapman, M., "Heterodyne and homodyne interferometry", Renishaw 2002.

Midgley, J.A. et al, "High-resolution laser homodyne interferometer", Electronics Letters, Mar. 25, 1971, vol. 7, No. 5/6.

Lee, W., "Recent developments in homodyne interferometry", Renishaw, Oct. 27, 2004.

Schattenberg, M. et al, "Metrology for the sub-100 nm domain via fiducial grids", MIT, Cambridge 2003.

Dobosz, M. et al, "Interference detection system for distance measuring interferometer", Optics & Laser Technology 44 (2012), 1620-1628, available online Dec. 20, 2011.

Steila, O. et al, "Automatic In-phase Quadrature Balancing AIQB".

Steila, O. et al, "Automatic In-phase Quadrature Balancing AIQB," Oct. 2006.

Agilent, Lasers and Optics: User'S Manual, vol. 1, Pub Sep. 2007, 310 Pages.

Counterpart United States Patent and Trademark Office Office Action Concerning U.S. Appl. No. 13/436,741, Mailed Feb. 13, 2015, 11 pages Including Notice of References Cited.

* cited by examiner

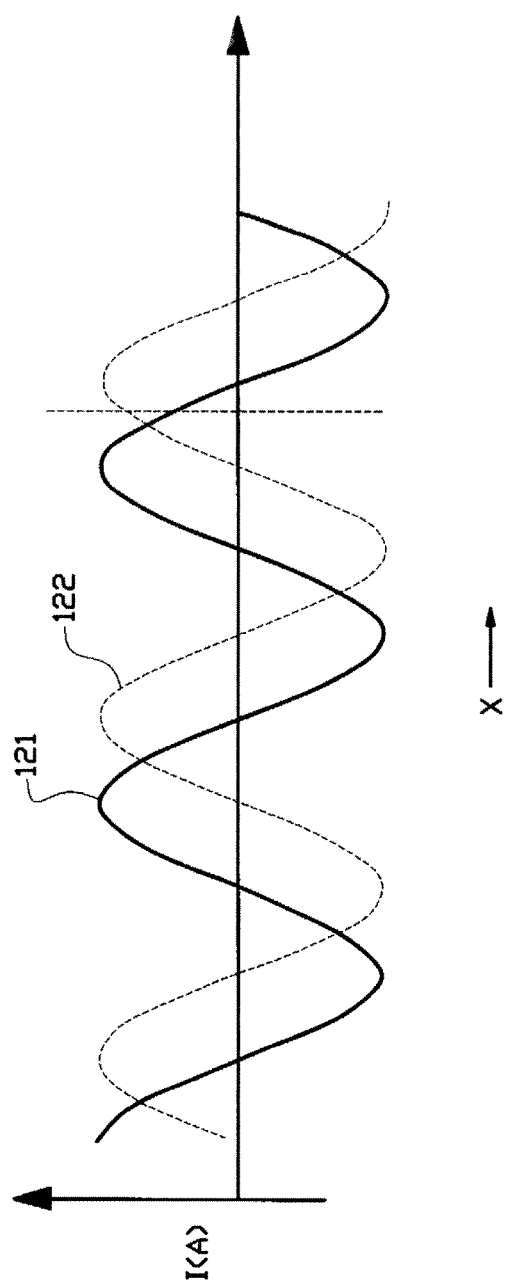

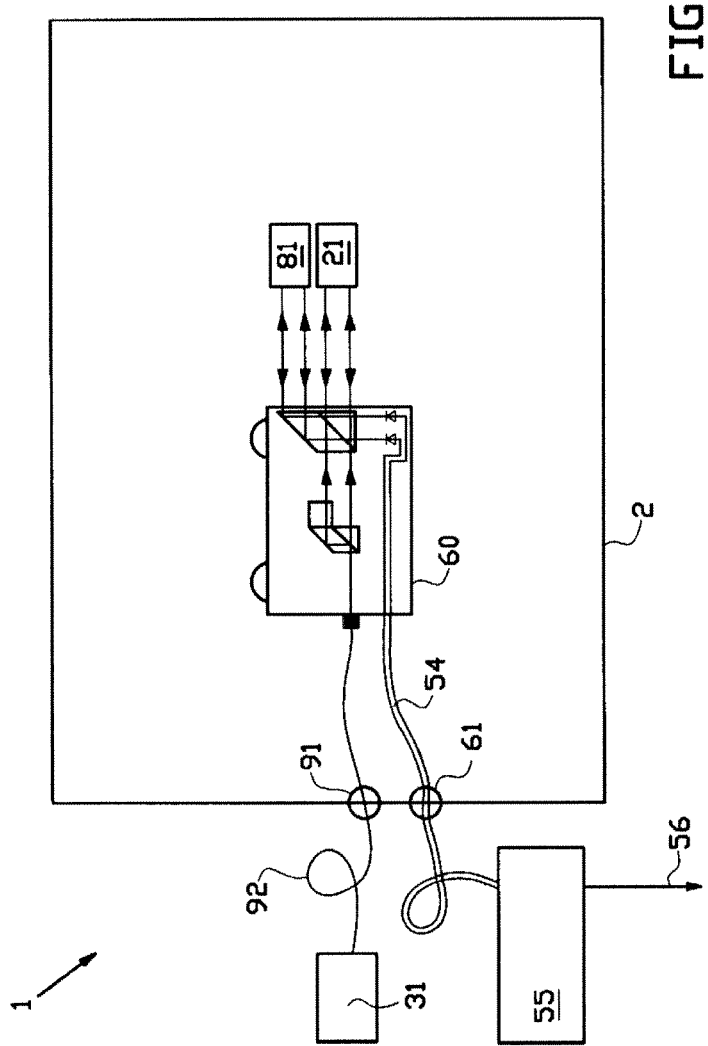
FIG. 6.B

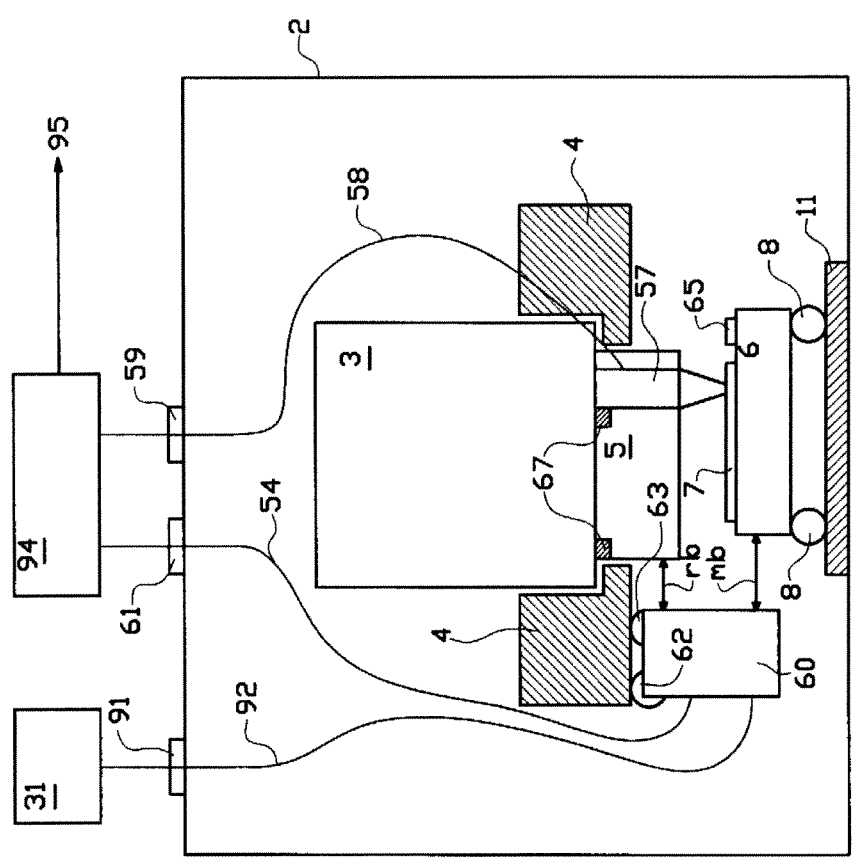

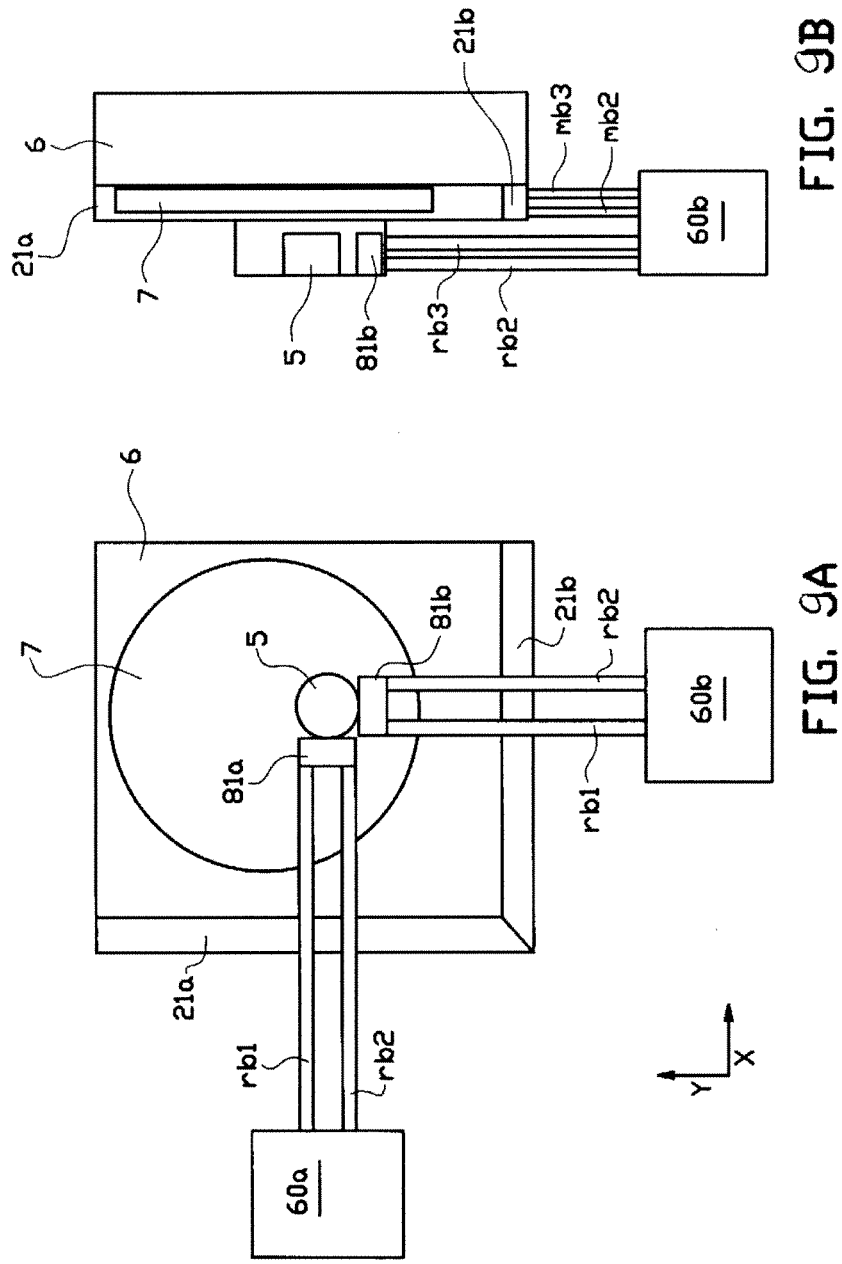

INTERFEROMETER MODULE

BACKGROUND

The invention relates to an interferometer module adapted for measuring a displacement between a reference mirror, for instance provided on the optical column of an exposure tool, and a measurement mirror, for instance provided on a target carrier of the exposure tool which is moveable relative to the optical column. The invention further relates to lithography system comprising such an interferometer module, and a method for measuring such a displacement.

U.S. Pat. No. 7,224,466 provides a compact differential interferometer for measuring a displacement between a measurement mirror and a reference mirror along two axes. The interferometer uses shared measurement and reference beams that respectively reflect from measurement and reference mirrors before that shared beams are split into individual beams corresponding to the measurement axes of the interferometer. By essentially reflecting the measurement beam and reference beam twice in the respective measurement mirror and reference mirror, the beam path is extended and the resolution of the interferometer improved. A drawback of the known interferometer module is that it not possible using said module to unambiguously determine a direction of a displacement between said measurement mirror and said reference mirror, i.e. whether they are brought closer together or farther apart.

It is an object of the present invention to provide a interferometer module allowing determination of a direction of displacement between a measurement mirror and a reference mirror.

SUMMARY OF THE INVENTION

According to a first aspect, the present invention provides an interferometer module adapted for emitting a measurement beam and an associated reference beam towards a respective measurement mirror and reference mirror, said interferometer module comprising: a beam combiner for combining a reflection of said measurement beam and said reference beam into a combined beam, a non-polarizing beam splitter for splitting said combined beam into a first split beam and a second split beam, each split beam comprising a component of said reference beam and said measurement beam, a first polarizing beam splitter, for splitting said first split beam into a first polarized beam having a first polarization and a second polarized beam having a second polarization, a second polarizing beam splitter, for splitting said second split beam into a third polarized beam having a third polarization and a fourth polarized beam having a fourth polarization, a first, second, third and fourth detector for detecting a beam energy of said first, second, third and fourth polarized beams respectively, wherein said polarizations of said first, second, third and fourth polarized beams are different polarizations. The four detectors provide four interference signals wherein each interference signal is typically a sinusoid signal shifted in phase relative to the other signals. It is thus possible to determine a direction of displacement between said measurement mirror and said reference mirror. Moreover, by using interpolating methods between the four signals, the resolution of the measurement may be improved. The coherent beams are internally coherent but are not necessarily coherent with respect to each other. The combined beams are formed by reflected reference and associated reflected measurement beams, which at least partially coincide at their corresponding beam detector.

In an embodiment the interferometer module is further adapted for emitting two additional measurement beams and two corresponding additional reference beams towards said measurement mirror and respective reference mirror, wherein said beam combiner is further adapted for combining reflections of said additional measurement beams and said corresponding additional reference beams into additional combined beams substantially parallel to said combined beam, wherein said non-polarizing beam splitter is arranged for splitting said additional beams into additional first split beams and additional second split beams, and wherein said first and second polarizing beam splitters are arranged for splitting said additional first split beams and said additional second split beams respectively into additional first, second, third and fourth polarized beams directed onto additional first, second, third and fourth detectors. Preferably, the additional measurement beams comprise two beams parallel to said measurement beam, wherein said measurement beam and additional measurement beams are emitted non-coplanarly towards the measurement mirror. Likewise, the additional reference beam preferably comprise two beams parallel to said reference beam, wherein said reference beam and additional measurement beams are emitted non-coplanarly towards the reference mirror. Thus the measurement beams may have define two substantially perpendicular planes, and the reference beams as well. Using such a module, it is possible to determine a relative displacement between said reference mirror and said measurement mirror along at least three measurement axes. From the detected beam energies a displacement along a direction x along the measurement beams may be determined, together with a rotation around axes Ry and Rz which are perpendicular to each other and to said direction x. As the same beam non-polarizing beam splitter is used to split all combined beams into said first split beam and second split beams, there is no need for aligning several different such beam splitters for each combined beam.

In an embodiment the interferometer module further comprises a blocking element comprising three irises, said blocking element arranged between said beam combiner and said non-polarizing beam splitter for partially blocking said combined beam and said two additional combined beams respectively. The irises function to filter out so called Jung-frequencies, and/or ensure that only center portions of each combined beam reach the non-polarizing beam splitter.

In an embodiment said blocking element comprises silicon, which is relatively insensitive to thermal deformation as compared to for instance aluminum. Preferably, the blocking element is manufactured using lithographic techniques.

In an embodiment said first polarizing beam splitter is rotated by 45 degrees relative to said second polarizing beam splitter.

In an embodiment said first polarizing beam splitter is adapted for splitting said first split beam such that said first polarized beam has a parallel polarization and said second polarized beam has a perpendicular polarization, and wherein said second polarizing beam splitter is adapted for splitting said second split beam such that said third polarized beam has a 45 degree polarization and said fourth polarized beam has a 135 degree polarization.

In an embodiment said non-polarizing beam splitter is directly adjacent to said first polarizing beam splitter and/or to said second polarizing beam splitter.

In an embodiment said beam combiner is fixedly attached to said non-polarizing beam splitter, forming a macro element. Such a macro-element less is sensitive to vibrations and misalignment during transport than when said beam combiner and non-polarizing beam splitter are separate elements.

In an embodiment said non-polarizing beam splitter is fixedly attached to said first polarizing beam splitter and/or to said second polarizing beam splitter using an optically neutral adhesive. The non-polarizing beam splitter and the first and second polarizing beam splitters may thus be formed as a macro-element. Besides a lower sensitivity to vibrations and/or misalignment, the use of such an optically neutral adhesive reduces the loss of light which occurs when a light beam traverses multiple interfaces between materials having different refractive indices.

In an embodiment said reference mirror is fixedly attached within said interferometer module. The reference beams thus remain within the module, while the measurement beams are emitted to a measurement mirror exterior to the module. The interferometer module is thus adapted for measuring a signal indicative of a displacement between said measurement mirror and said interferometer module.

In an alternative embodiment said interferometer module is a differential interferometer module, further comprising: a beam source adapted for providing three coherent beams, a beam splitter unit adapted for splitting said three beams into respective pairs of measurement beams and associated reference beams, wherein the three measurement beams are incident on a first mirror, and wherein the three reference beams are incident on a second mirror moveable with respect to said first mirror, wherein said beam combiner is arranged for combining each reflected measurement beam with its associated reflected reference beam to a combined beam of said combined beams. The module emits said reference beams and said measurement beams to said reference mirror and measurement mirror respectively, i.e. both said reference beams and the measurement beams are emitted to a location outside of the module. The differential interferometer module is adapted for measuring a displacement between said measurement mirror and said reference mirror along three non-coplanar measurement axes. It is thus possible, using a single interferometer module, for instance to determine a relative displacement between said mirrors along three different measurement axes.

In an embodiment said beam splitter unit comprises a single beam splitter for splitting said three beams into three measurement beam/reference beam pairs.

In an embodiment said beam detectors each comprise a beam intensity detector or a beam energy detector for detecting an intensity or energy of a corresponding combined beam. Alternatively, the beam detectors may each comprise a light detector for detecting the optical power, or energy, of a beam emitted thereon.

In an embodiment the beam splitter unit is adapted for emitting said three measurement beams non-coplanarly, and/or for emitting said three reference beams non-coplanarly. The interferometer module according to the invention thus makes it possible to determine a displacement between said mirrors along a direction x, and a rotation around directions Rz and Rz which are perpendicular to each other and to direction x.

In an embodiment a first incident measurement beam and a second incident measurement beam span a first plane and the second incident measurement beam and a third incident measurement beam span a second plane at an angle $\alpha$ to the first plane, and a first incident reference beam and a second incident reference beam span a third plane and the second incident reference beam and a third incident reference beam span a fourth plane at substantially the same angle $\alpha$ to said third plane.

In an embodiment said angle $\alpha$ is 90°.

In an embodiment the second plane and the fourth plane substantially coincide.

In an embodiment the three incident measurement beams are substantially parallel to each other and/or the three incident reference beams are substantially parallel to each other.

In an embodiment each of said three incident measurement beams is substantially parallel to its associated incident reference beam.

In an embodiment said first and second mirror are spaced apart from said module.

In an embodiment the inside of said module is substantially filled with a solid material, preferably a cured epoxy-resin, more preferably Stycast®. As the optical elements of the module are thus securely held in place, the module is less susceptible to alignment errors due to vibrations or handling.

In an embodiment the beam splitter and the beam combiner are comprised in a single integrated unit.

According to a second aspect the present invention provides an interferometer module comprising: a beam source adapted for providing three coherent beams, a beam splitter adapted for splitting said three beams into respective pairs of measurement beams and associated reference beams, wherein the three measurement beams are incident on a first mirror, and wherein the three reference beams are incident on a second mirror moveable with respect to said first mirror, wherein said beam combiner is arranged for combining each reflected measurement beam with its associated reflected reference beam to a combined beam, and a housing, wherein said beam splitter and said beam combiner are arranged within the housing, and said housing a first set of three holes for allowing passage of said three measurement beams and said three reflected measurement beams from within to housing to outside said housing and vice versa, and a second set of three holes for allowing passage of said three reference beams from within said housing to outside said housing and vice versa.

According to a third aspect the present invention provides a lithography system comprising an interferometer module according to any one of the preceding claims, said system further comprising: an optical column for projecting a pattern onto a target, a target carrier for moving said target relative to the optical column, a controller, for controlling movement of said target carrier relative to the optical column, wherein the target carrier is provided with a first mirror, and wherein the optical column is provided with a second mirror, wherein said interferometer is arranged for emitting said measurement beam on said first mirror and said reference beam on said second mirror, wherein said controller is adapted for controlling movement of said target carrier relative to said optical column based on the energies of beams detected by said first, second, third and fourth detectors. The lithography system is preferably a lithography system adapted for projecting said pattern onto said target during movement of the target carrier relative to the projection optics. More preferably, the lithography system is a charged particle lithography system adapted for projecting a plurality of charged particle beamlets onto said target.

According to a fourth aspect, the present invention provides a method of determining a displacement of a measurement mirror relative to a reference mirror using an interferometer module according to any one of the preceding claims, said method comprising the steps of: measuring the energies of said first, second, third and fourth polarized beams at said first, second, third and fourth detector respectively, providing a first displacement signal as a difference between said first and second measured energy, and providing a second displacement signal as a difference between said third and fourth measured energy. Alternatively, instead of measuring the energies, beam intensities may be measured.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which:

FIG. 1B shows a graph of signals obtained using a differential interferometer module of FIG. 1A, FIG. 2A schematically shows a cross-sectional side view of a differential interferometer module similar to that of FIG. 1A, with the optical elements of the lower section adjacent to each other, FIG. 2B schematically shows a cross-sectional side view of a differential interferometer module similar to that of FIG. 1A, in which the optical elements of the lower section are attached each other using an optically neutral adhesive, FIGS. 3A and 3B schematically show embodiments in which all optical elements are adjacent, forming a single unit, FIG. 4 schematically shows an embodiment of the invention for emitting three non-coplanar measurement beams and corresponding reference beams, FIG. 5 schematically shows an embodiment of the invention, further comprising two beam path adjusters, for changing the mutual distances between the reference beams and the measurement beams respectively, FIGS. 6A and 6B show schematic side views of a lithography system according to the present invention, FIG. 6C shows a schematic side view of a further embodiment of a lithography system according to the present invention, FIGS. 9A and 9B show a top view and a side view respectively of a lithography system comprising two interferometer modules according to the present invention.

DETAILED DESCRIPTION OF THE INVENTION

Figure 1A:
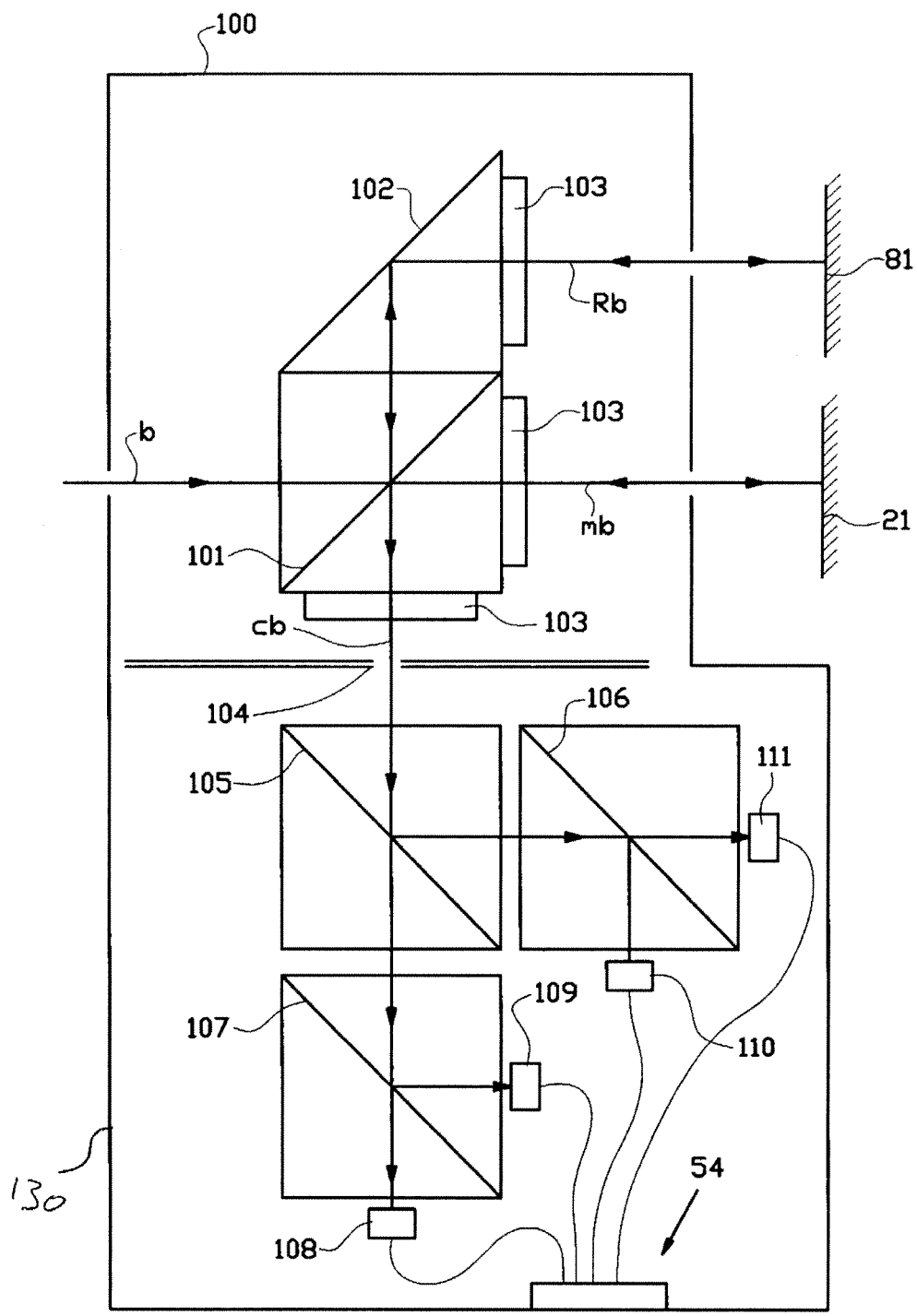
FIG. 1A schematically shows a cross-sectional side view of a differential interferometer module according to the invention.

FIG. 1A shows a detail of a preferred embodiment of an interferometer module 100 according to the present invention. A single coherent beam b is emitted onto polarizing beam splitter 101, which splits the beam b into a polarized measurement beam Mb and an associated polarized reference beam Rb. After having passed the polarizing beam splitter 101, the measurement beam Mb passes a quarter wave plate 103. The incident measurement beam is then reflected back by first mirror 21, and again passes the quarter wave plate 103. Subsequently the reflected measurement beam is reflected through an iris 140 by the polarizing beam splitter 101.

Similarly, the part of the coherent beam that forms the reference beam Rb is reflected by prism 102 through a quarter wave plate 103 and incident on second mirror 81. The reference beam Rb is then reflected back by mirror 81 and again passes through the same quarter wave plate 103, after which it is reflected by prism 102, through polarizing beam splitter 101 towards iris 104.

Thus, when the interferometer module is active, a combined beam Cb passes the iris 104. A non-polarizing beam splitter 105 splits the combined beam up into two, wherein the two combined beam portions into which the combined beam is split up comprise both a portion of the reflected reference beam and a portion of the reflected measurement beam. The two beam portions in turn are split up by polarizing beam splitters 106 and 107 respectively. The polarizing beam splitter 106 is rotated 45 degrees with respect to polarizing beam splitter 107. Thus four distinct combined beam portions result, having a parallel polarization, a perpendicular polarization, a 45 degree polarization and a 135 degree polarization respectively. Detectors 108, 109, 110 and 111, convert intensities of these four combined beam portions into a first signal sig1, a second signal sig2, a third signal sig3 and a fourth signal sig4 respectively. The beam splitter and the beam combiner are arranged within a housing 130 of the module.

FIG. 1B shows a graph of a difference between said signals sig1 and sig2, and of a difference between said signals sig3 and sig4 as a target carrier, for instance comprising the measurement mirror, is moved at a constant velocity with respect to the projection optics, which for instance comprises the reference mirror. The graph shows two sinusoidal curves 121, 122 that are used to determine a wafer table displacement and thus the wafer table position.

When only a single sinusoid curve is available, it may be difficult to determine a direction of relative movement when a change in intensity from a peak level to a lower level occurs, as both movement of the wafer table towards and away from the optical column will result in a lower intensity signal. According to the present invention, a direction of movement can be determined at any time by using two sinusoid curves that are out of phase with respect to each other, for instance out of phase by 45 degrees. A further advantage of using two curves instead of one is that measurements may be carried out more accurately. For instance, when a peak is measured for curve 121, a small movement to either side will result in a small change in measured intensity signal of the curve. However, the same small movement results in a large change in measured intensity signal of curve 122, which may then be used to determine the displacement instead.

Figure 2A:
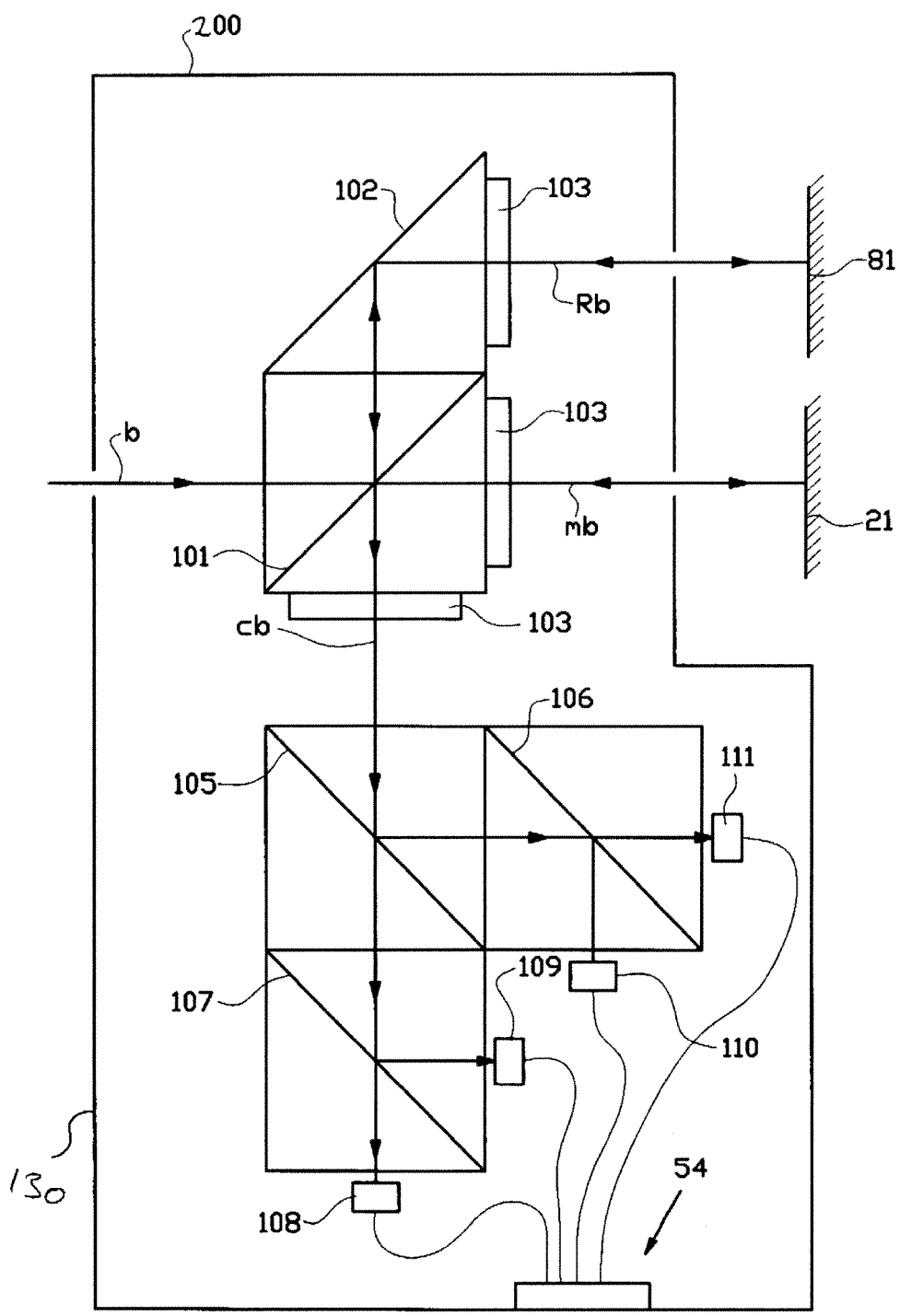
Figure 2B:
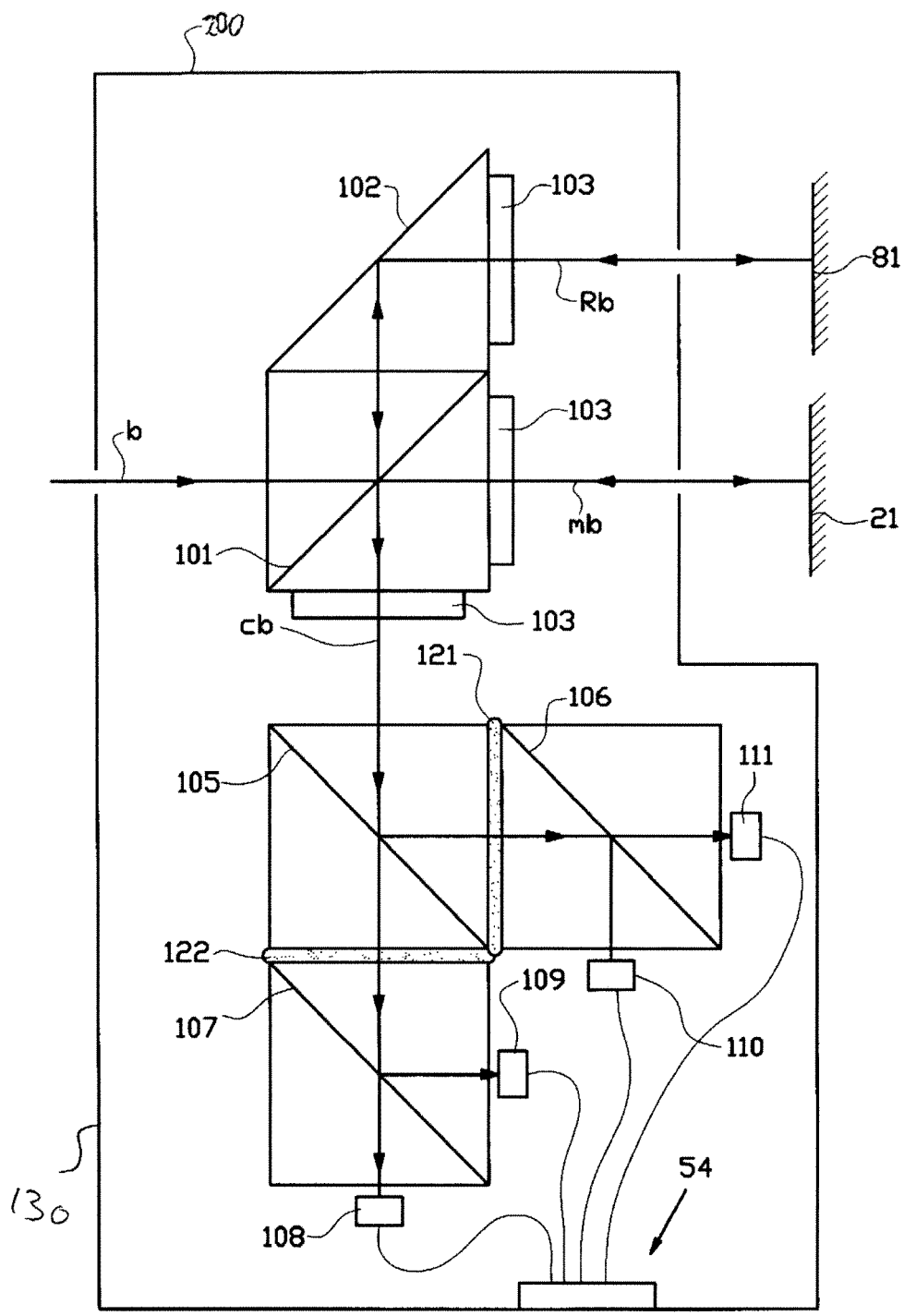

FIGS. 2A and 2B schematically show interferometer module or head 200 according to the invention similar to the embodiment shown in FIG. 1A. However, in FIG. 2A, non-polarizing beam splitter 105 is arranged directly adjacent to polarizing beam splitters 106 and 107, such that there are fewer interfaces between materials with different refractive indices when compared to FIG. 1A, resulting in reduced loss of light.

In FIG. 2B, non-polarizing beam splitter 105 is attached to polarizing beam splitters 106 and 107 by means of a layer of an optically transparent adhesive 121 and 122 respectively, here shown having an exaggerated width. This embodiment offers the additional advantage that beam splitters 105, 106, 107 with each other is less susceptible to become misaligned, for instance due to vibrations or handling.

Figure 3A:
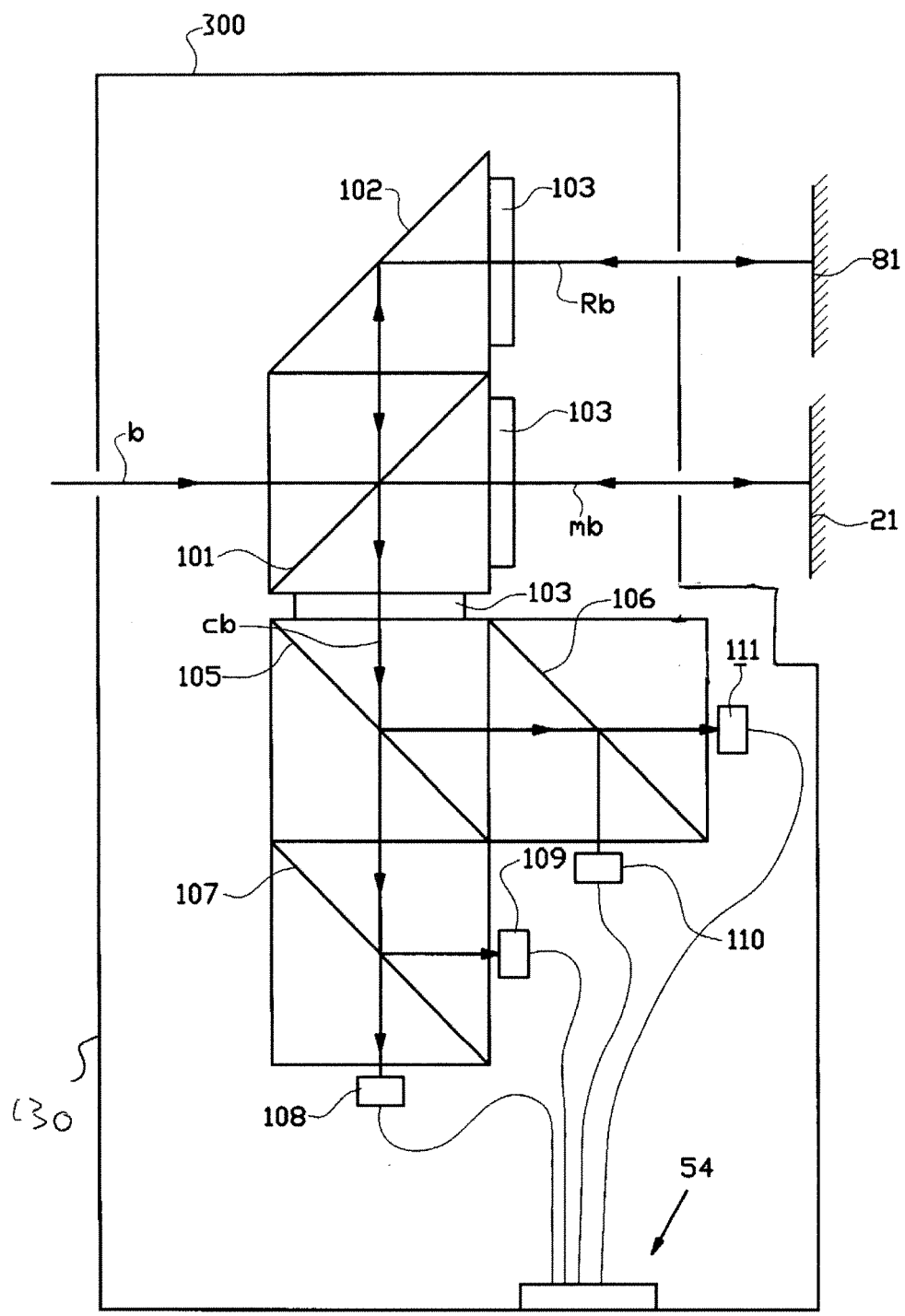

FIG. 3A schematically shows an interferometer module 300 according to the invention, in which the optical elements are all adjacent. Non-polarizing beam splitter 105 is adjacent to quarter wave plate 103 between said beam splitter 105 and polarizing beam splitter 101. Non polarizing beam splitter 105 is further adjacent to polarizing beam splitters 106 and 107. This embodiment is particularly easily assembled, as alignment of the optical elements with each other is achieved by arranging the optical elements such that they are adjacent, i.e. abut along planar surfaces.

Figure 3B:
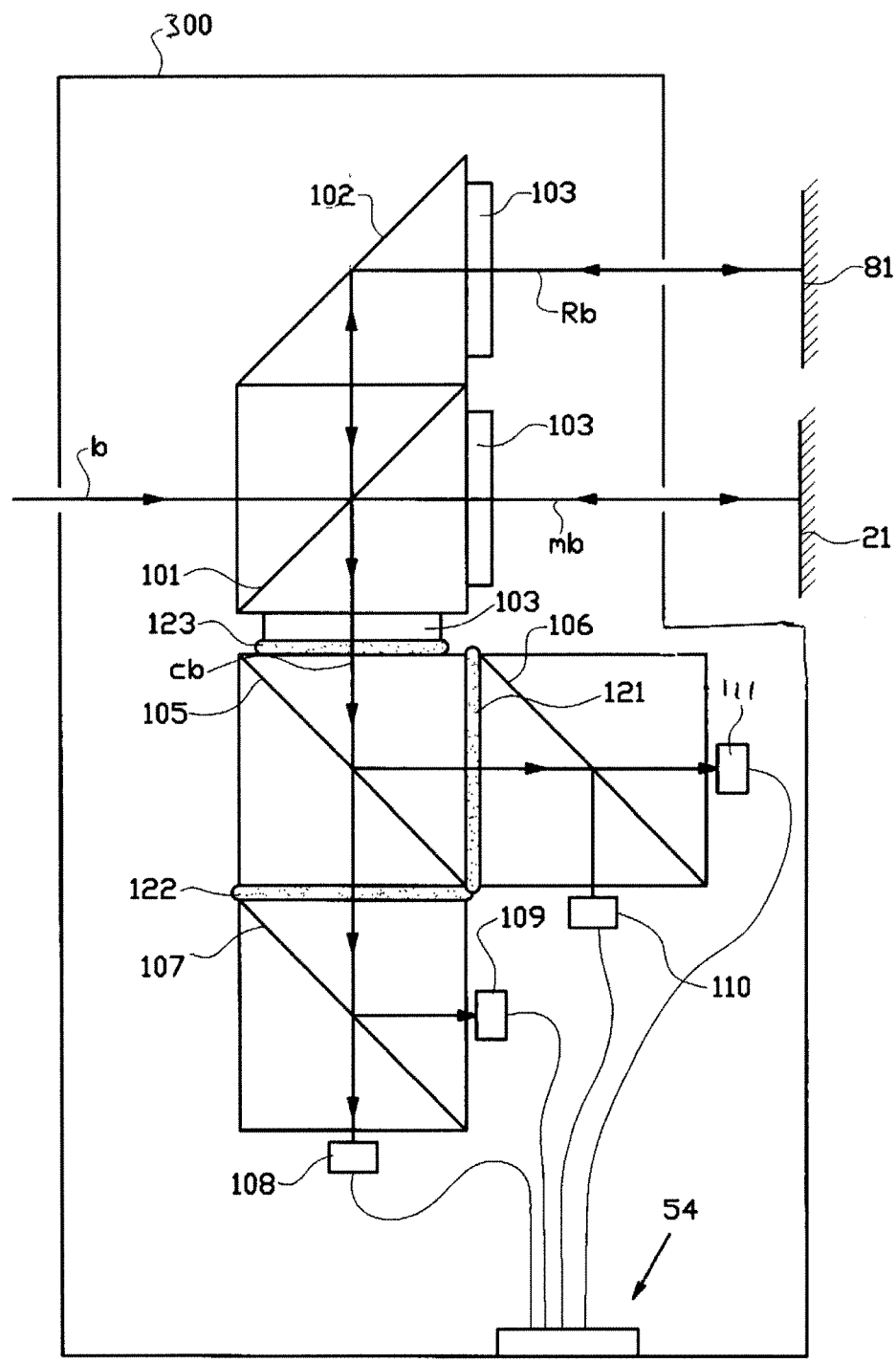

In FIG. 3B a fixed connection between non-polarizing beam splitter 105 and its neighboring optical components is provided by layers 121,122,123 of an optically transparent adhesive.

Figure 4:
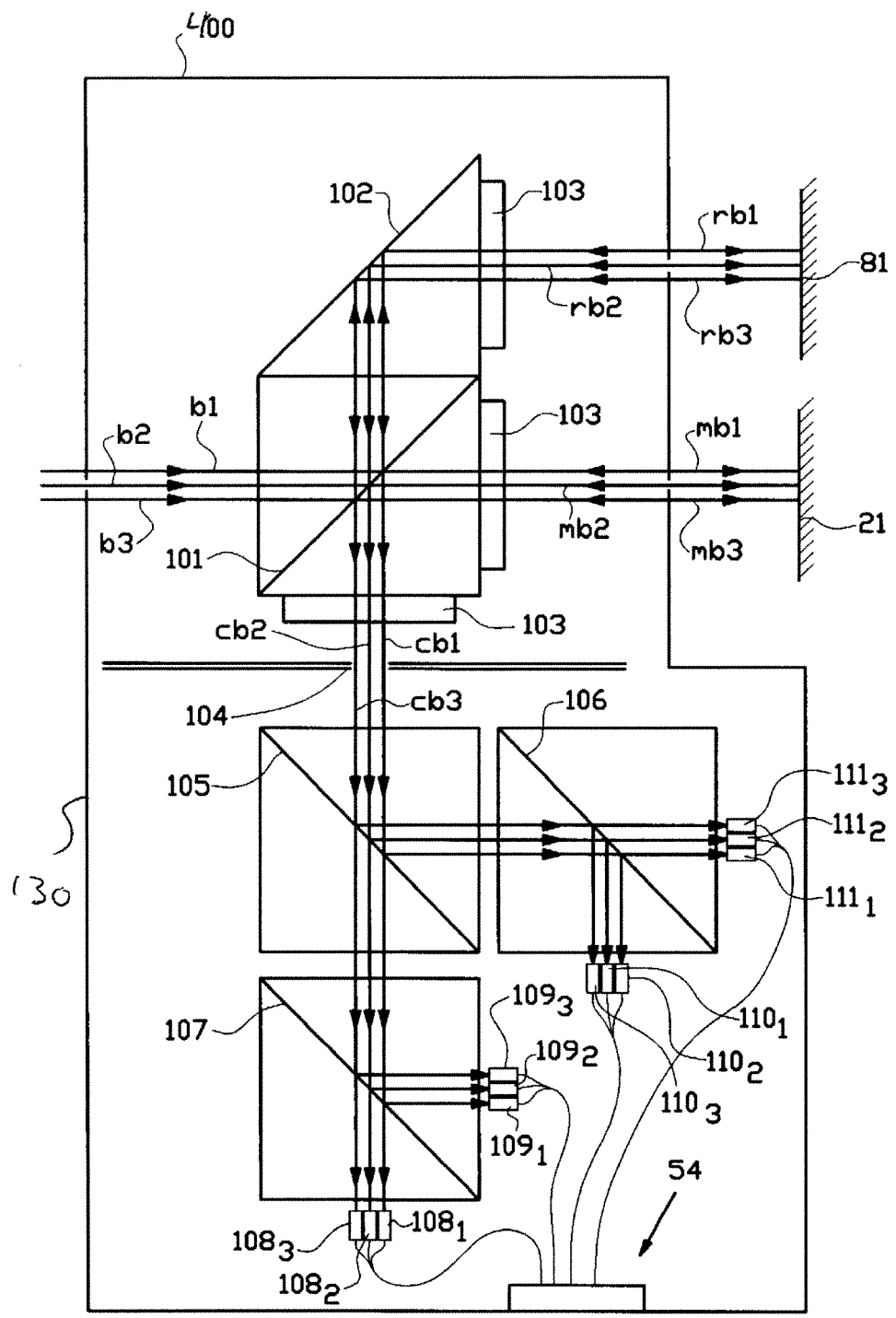

FIG. 4 schematically shows an interferometer module or head 400 according to the invention similar to the embodiment shown in FIG. 1A, however wherein three coherent light beams b1,b2,b3 are incident on polarizing beam splitter 101 instead of only one. This results in three reference beams rb1,rb2,rb3 being emitted towards the second mirror 81, and three measurement beams being emitted towards the first mirror 21. The three reference beams and associated three measurement beams are emitted non-coplanarly from the module. The housing 130 is to this end provided with two sets of three holes each, the first set allowing passage of the three measurement beams and the second set allowing passage of the three reference beams from the The three reflected reference beams and associated three reflected measurement beams are combined into three combined beams which pass the iris 104 and are split up in the same manner as described above. Beam receiving intensity detectors $108_1, 108_2, 108_3$ detect an interference of a portion of each of the combined beams cb1,cb2,cb3 respectively. Detectors $109_1, 109_2, 109_3$, $110_1, 110_2, 110_3$, $111_1, 111_2, 111_3$ function likewise for combined beam portions with different polarizations, resulting in a total of 12 detection signals. From these detection signals 6 sinusoidal curves can be constructed which provide information on relative displacement and rotation of the two mirrors 81,21.

Figure 5:
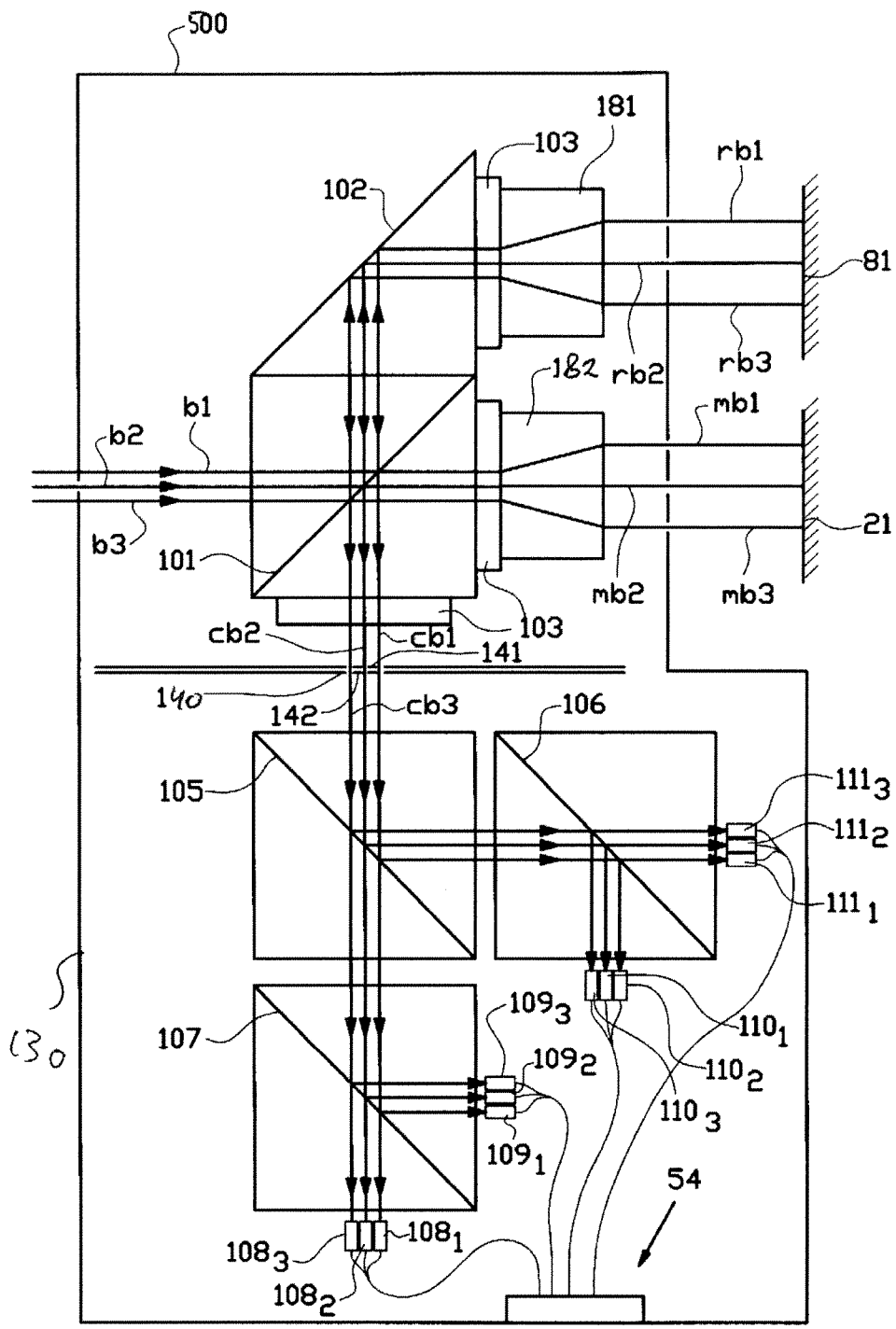

FIG. 5 schematically shows an interferometer module or head according to the invention similar to the embodiment shown in FIG. 4. However, instead of iris 104, a blocking element 140 is provided with three separate irises 141,142, 143 for letting through only a center portion of respective combined beams cb1,cb2,cb3. Moreover, the embodiment of FIG. 5 is provided with beam path adjusters 181,182 which respectively adjust the mutual distances between reference beams rb1,rb2 and rb3, and the mutual distances between measurement beams mb1,mb2 and mb3. The beam path adjusters 181,121 each comprise a number of internal reflection prisms for adjusting the path of the reference beams rb1,rb2,rb3 and measurement beams mb1,mb2,mb3 respectively, wherein the beam path adjusters are provided with separate prisms for each beam. Alternatively, the beam path adjusters may comprise two mirrors for each beam to achieve a similar effect. In an embodiment (not shown), the beam path adjusters 121 and/or 181 comprise Fresnel rhombs arranged to act as a quarter wave plate. In this last embodiment, both quarter wave plates 103 facing mirrors 81 and 21 may be omitted. It is noted that although FIGS. 4 and 5 schematically depict the beams b1,b2 and b3 coplanarly, in reality the three beams are parallel yet non-coplanar, and the resulting reference and measurement beams are emitted non-coplanarly onto their respective mirrors. Likewise, in the ireses 141,142, 142 are typically arranged in an L-configuration on the blocking element 140.

Figure 6A:
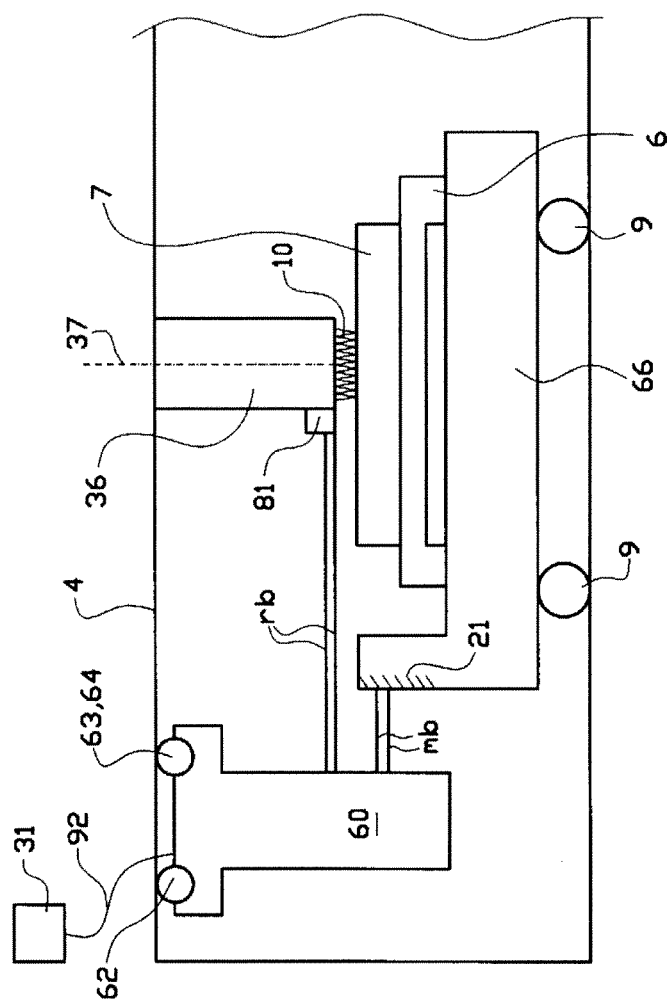

FIG. 6A shows a lithography system 1 according to the present invention. The system comprises a frame 4, to which an optical column 36 having an optical axis 37 is mounted. The optical column is adapted for projecting a plurality of exposure beamlets 10 onto a target 7. By selectively switching selected exposure beamlets on or of, an exposure surface of the target below the optical column may be patterned. The target is placed on a wafer table 6, which in turn is placed on a chuck 66 which is moveable with respect to the optical column 36 by means of a stage 9 on which the chuck 66 is placed. In the embodiment shown, the chuck, wafer table and stage form a target carrier for moving the target 7 relative to the optical column 36.

The chuck 66 comprises a first mirror 21, comprising a substantially planar surface at substantially the same level or height within the system as the target 7 or exposure surface thereof. The optical column comprises a second mirror 81, which comprises a substantially planar surface close to the projection end of the optical column.

The system further comprises a modular interferometer head 60, or differential interferometer module, which is mounted to the frame 4 by means of a kinematic mount 62,63,64. The modular interferometer head 60 emits reference beams Rb onto the second mirror 81, and associated measurement beams Mb onto the first mirror 21. Though not shown in this figure, the reference beams comprise three reference beams, and the measurement beams comprise three measurement beams, and a relative movement between the first mirror 81 and second mirror 21 is measured by evaluating an interference between a reference beam and its associated measurement beam.

The three measurement beams Mb and the three reference beams Rb originate from a laser unit 31 which supplies a beam of coherent light, and which is coupled into the interferometer module 60 via an optical fiber 92 which forms part of a beam source for the module 60.

FIG. 6B schematically shows the lithography system 1 of FIG. 6A, wherein the lithography system comprises a vacuum housing 2. Within the vacuum housing 2, only the interferometer head 60 and its connections, and first 81 and second mirrors 21 are shown, though it will be understood that the target carrier of FIG. 6A will be contained within the vacuum chamber 2 as well.

The optical fiber 92 from laser 31 passes through a wall of said vacuum chamber 2 through a vacuum feed-through 91. Signals representative of interference between measurement beams and their associated reference beams are transported from the interferometer module 60 out of the vacuum chamber 2 via signal wires 54, which pass through vacuum feed-through 61.

FIG. 6C schematically shows a lithography system similar to the system shown in FIG. 1A, wherein the system is a charged particle beam lithography system comprising electron optics 3 for providing a plurality of charged particle beamlets, and wherein the projection optics 5 comprise a plurality of electrostatic lenses for individually focusing said charged particle beamlets onto an exposure surface of the target 7. The projection optics 5 comprises actuators 67 for adjusting an orientation and/or position of the projection optics relative to the frame 4. The system further comprises a signal processing module 94 adapted providing a position and/or displacement signal to a stage control unit 95 for controlling movement of a stage 11. Signals are transmitted from the interferometer module 60 and the alignment sensor 57 via signal wires 54,58 which pass through vacuum feed-throughs 61 and 59, to the signal processing module 94, which processes these signals to provide a signal for actuating the stage 11 and/or the projection optics 5. The displacement of the wafer table 6, and thus of the target 7 supported thereby relative to projection optics 5 is thus continuously monitored and corrected.

In the embodiment shown, the wafer table 6 is supported by a moveable stage 11 via a kinematic mount 8, and the stage 9 may be moved relative to the projection optics 5 in a direction towards or away from the interferometer module 60. The differential interferometer module 60 emits three reference beams towards a mirror on the projection optics, and emits three measurement beams towards a mirror on the wafer table.

Figure 7A:
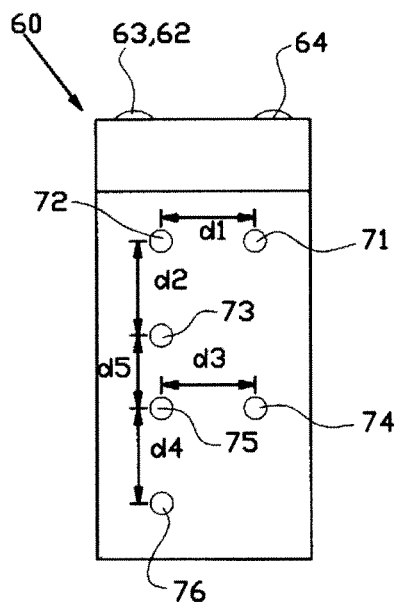
FIGS. 7A and 7B show a schematic front view and an isometric view respectively of a differential interferometer module according to the present invention.
Figure 7B:
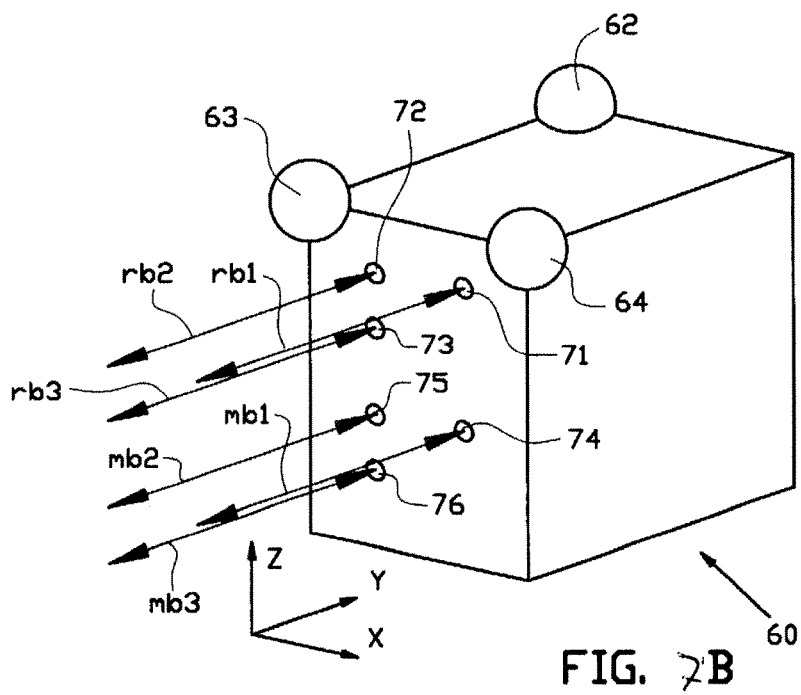

FIGS. 7A and 7B shows a front view and an isometric view respectively of the interferometer module of FIG. 6A. The interferometer module 60 comprises a kinematic mount 62,63,64 for easy and highly precise alignment of the module during mounting of the module on the frame. The interferometer module comprises three holes 71,72,73 for emitting three corresponding reference beams rb1,rb2,rb3, as well as for receiving reflections thereof back into the module. The interferometer module further comprises three holes 74,75,76 for emitting three corresponding measurement beams mb1,mb2, mb3, as well as for receiving reflections thereof back into the module. Hole 73 for emitting a reference beam is located at a distance d5 of 4 mm from hole 75 for emitting a measurement beam. Holes 71 and 72 are spaced apart by a distance d1, holes 72 and 73 by a distance d2, holes 74 and 75 by a distance d3 equal to distance d1, and holes 75 and 76 by a distance d4 equal to distance d2. In the embodiment shown the distances d1,d2,d3,d4 and d5 are center-to-center distances equal to 12, 5, 12, 5 and 4 millimeter respectively. In FIG. 2B in can be seen that the first reference beam rb1 and second reference beam rb2 span a first plane, and the second reference beam rb2 and third reference beam rb3 span a second plane, wherein the second plane is at an angle α (not shown) of 90 degrees with respect to the first plane. Likewise, the first measurement beam mb1 and second measurement beam mb2 span a third plane, and the second measurement beam mb2 and third measurement beam mb3 span a fourth plane, wherein the third plane is at substantially the same angle α (not shown) with respect to the fourth plane.

Figure 8A:
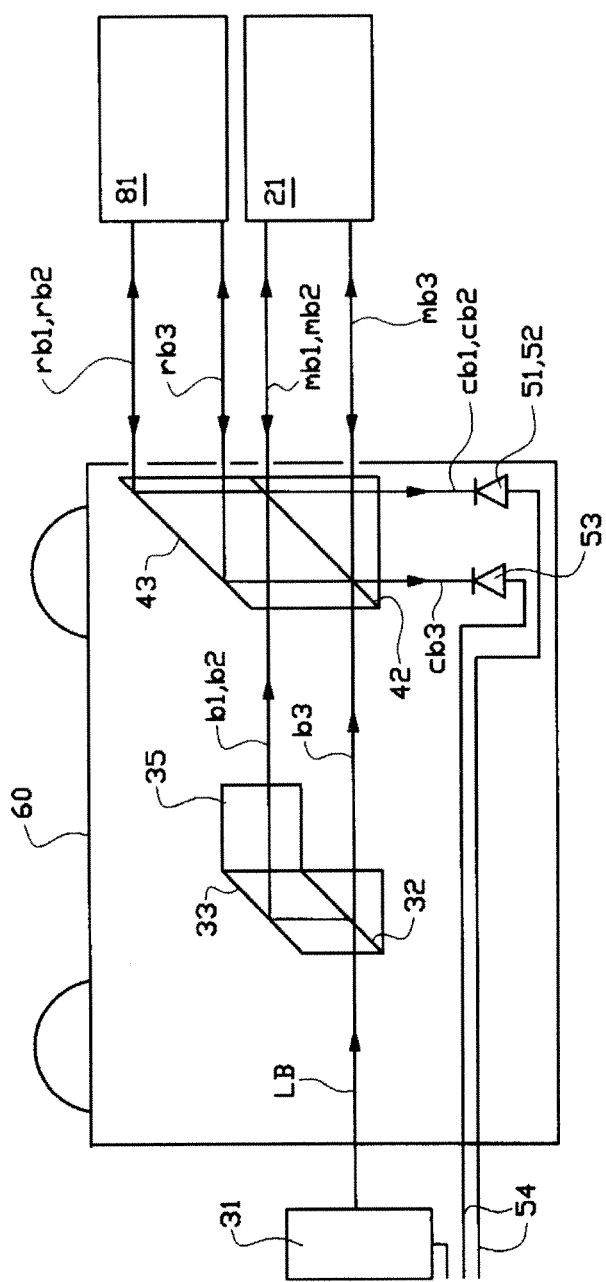
FIGS. 8A and 8B show a cross-sectional side view and a cross-sectional top view a an differential interferometer module according to the invention.
Figure 8B:
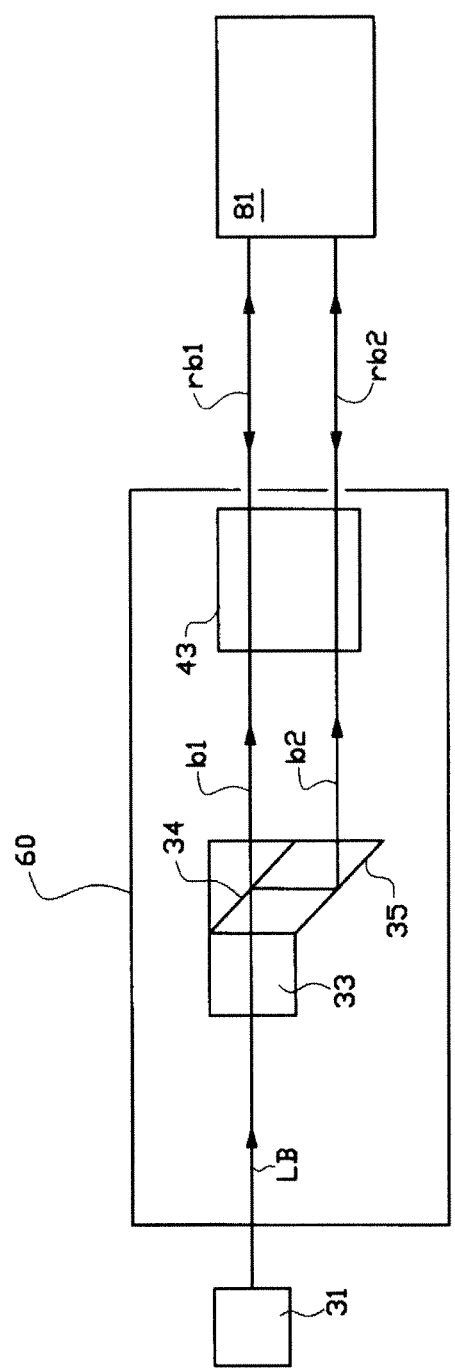

FIGS. 8A and 8B show a schematic side view and top view respectively of an embodiment of the differential interferometer module 60 according to the present invention. The module comprises a primary beam splitter unit 32,33,34, for splitting a laser beam LB emitted by laser unit 31 up into three coherent light beams b1,b2,b3. The primary beam splitter unit shown is a unit comprising two beam splitters 32,34 and two reflecting prisms 33,35. Each of the coherent light beams b1,b2,b3 are then emitted toward a secondary beam splitter unit 42,43, adapted for splitting said three coherent light beams b1,b2,b3 up into respective measurement and associated reference beam pairs. The first of these pairs comprises measurement beam rb1 and associated reference beam rb1, the second of these pairs comprises measurement beam rb2 and associated reference beam rb2, and the third pair comprises measurement beam rb3 and associated reference beam rb3.

Thus 6 beams are emitted from the secondary beam splitter unit, three reference beams rb1,rb2,rb3 and three associated measurement beams mb1,mb3,mb3.

The reference beams rb1,rb2,rb3 are emitted incident on second mirror 81 of the optical column, while the measurement beams mb1,mb2,mb3 are emitted incident on first mirror 21 of the target carrier. The reference and measurement beams are reflected back into the module 60, in particular back into secondary beam splitter unit 42,43, which acts as a beam combiner 42,43 for the reflected measurement beams and their associated reference beams. The beam combiner thus emits three combined beams cb1,cb2,cb3, wherein each of said combined beams is formed by a reflected measurement beam and its associated reference beam at least partially overlapping at corresponding light receivers 51,52,53 or beam detectors, in this case light intensity detectors 51,52,53 comprising photo-diodes. A changing interference of the measurement beams and associated reference beams at any of the beam receivers results in a change in the light intensity at that beam receiver. The photo-diodes convert a light intensity signal to an electrical signal, which is fed out of the module 60 unamplified.

FIGS. 9A and 9B show a top view and a side view of a lithography system according to the present invention, in which a first and a second differential interferometer module 60A,60B as described herein are arranged for measuring a displacement of the wafer 7 relative to projection optics 5. The projection optics is provided with two planar mirrors 81A, 81B, arranged at a 90 degrees angle with respect to each other. The wafer 7 is supported by a wafer table 6 which comprises two planar mirrors 21A and 21B arranged at a 90 degrees angle with respect to each other as well. The first differential interferometer module 60A emits three reference beams rb1,rb2,rb3 on mirror 81A of the projection optics, and emits three measurement beams on mirror 21A of the wafer table. Similarly, the second differential interferometer module 60B emits reference beams on mirror 81B of the projection optics, and emits measurement beams on mirror 21B of the wafer table.

In summary the present invention relates to a differential interferometer module adapted for measuring a direction of displacement between a reference mirror and a measurement mirror. In an embodiment the differential interferometer module is adapted for emitting three reference beams towards a first mirror and three measurement beams towards a second mirror for determining a displacement between said first and second mirror. In a preferred embodiment the same module is adapted for measuring a relative rotation around two perpendicular axes as well. The present invention further relates to a method for measuring such a displacement and rotations.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

IN THE FIGURES

LB laser beam
b coherent beam
cb combined beam
cb1,cb2,cb3 combined beams
b1,b2,b3 coherent beams
rb1,rb2,rb3 reference beams
rb reference beams
mb1,mb2,mb3 measurement beams
mb measurement beams
sig1,sig2,sig3,sig4 intensity signals
1 lithography system
2 vacuum housing
3 electron optics
4 frame
5 projection optics
6 wafer table
7 wafer
8 kinematic mount
9 stage
10 plurality of exposure beamlets
11 stage
21,21A,21B first mirror
31 laser unit
32,34,42 beam splitter
33,35,43 prism 36 optical column
37 optical axis
51,52,53 light detectors
54,58 signal wires
55 electronics of interferometer
56 measurement of position second mirror with respect to first mirror
57 alignment sensor
59,61 vacuum feed-through
60, 60A, 60B interferometer head/interferometer module
62,63,64 kinematic mount
65 alignment marker
66 chuck
67 actuators of projection optics
71,72,73 holes for measurement beams
74,75,76 holes for reference beams
81, 81A,81B second mirror
91 vacuum feed-through
92 optical fiber
94 signal processing module
95 stage control
100,200,300,400 interferometer module/interferometer head
101 polarizing beam splitter
102 prism
103 quarter wave plate
104 iris
105 non polarizing beam splitter
106,107 polarizing beam splitter
108, $108_1$, $108_2$,$108_3$ detectors
109, $109_1$, $109_2$,$109_3$ detectors
110, $110_1$, $110_2$,$110_3$ detectors
111, $111_1$, $111_2$,$111_3$ detectors
121,122 sinusoidal curves
130 housing
140 blocking element
141,142,143 iris
121,181 beam path adjuster

The invention claimed is:

1. Interferometer module adapted for emitting a measurement beam and an associated reference beam towards a respective measurement mirror and reference mirror, said interferometer module comprising:
   a beam combiner for combining a reflection of said measurement beam and said reference beam into a combined beam,
   a non-polarizing beam splitter for splitting said combined beam into a first split beam and a second split beam, each split beam comprising a component of said reference beam and said measurement beam,
   a first polarizing beam splitter, for splitting said first split beam into a first polarized beam having a first polarization and a second polarized beam having a second polarization,
   a second polarizing beam splitter, for splitting said second split beam into a third polarized beam having a third polarization and a fourth polarized beam having a fourth polarization,
   a first, second, third and fourth detector for detecting a beam energy of said first, second, third and fourth polarized beams respectively,
   wherein said polarizations of said first, second, third and fourth polarized beams are different polarizations.

2. Interferometer module according to claim 1, further adapted for emitting two additional measurement beams and two corresponding additional reference beams towards said measurement mirror and respective reference mirror, wherein said beam combiner is further adapted for combining reflections of said additional measurement beams and said corresponding additional reference beams into additional combined beams substantially parallel to said combined beam, wherein said non-polarizing beam splitter is arranged for splitting said additional beams into additional first split beams and additional second split beams, and wherein said first and second polarizing beam splitters are arranged for splitting said additional first split beams and said additional second split beams respectively into additional first, second, third and fourth polarized beams directed onto additional first, second, third and fourth detectors.

3. Interferometer module according to claim 1 or claim 2, further comprising a blocking element comprising three irises, wherein said blocking element is arranged between said beam combiner and said non-polarizing beam splitter for partially blocking said combined beam and said two additional combined beams respectively.

4. Interferometer module according to claim 3, wherein said blocking element comprises silicon.

5. Interferometer module according to claim 1, wherein said first polarizing beam splitter is rotated by 45 degrees relative to said second polarizing beam splitter.

6. Interferometer module according to claim 1, wherein said first polarizing beam splitter is adapted for splitting said first split beam such that said first polarized beam has a parallel polarization and said second polarized beam has a perpendicular polarization, and wherein said second polarizing beam splitter is adapted for splitting said second split beam such that said third polarized beam has a 45 degree polarization and said fourth polarized beam has a 135 degree polarization.

7. Interferometer module according to claim 1, wherein said non-polarizing beam splitter is directly adjacent to said first polarizing beam splitter and/or to said second polarizing beam splitter.

8. Interferometer module according to claim 1, wherein said beam combiner is fixedly attached to said non-polarizing beam splitter, forming a macro element.

9. Interferometer module according to claim 1, wherein said non-polarizing beam splitter is fixedly attached to said first polarizing beam splitter and/or to said second polarizing beam splitter using an optically neutral adhesive.

10. Interferometer module according to claim 1, wherein said reference mirror is fixedly attached within said interferometer module.

11. Interferometer module according to claim 1, wherein said interferometer module is a differential interferometer module, further comprising
   a beam source adapted for providing three coherent beams,
   a beam splitter unit adapted for splitting said three beams into respective pairs of measurement beams and associated reference beams, wherein the three measurement beams are incident on a first mirror, and wherein the three reference beams are incident on a second mirror moveable with respect to said first mirror,
   wherein said beam combiner is arranged for combining each reflected measurement beam with its associated reflected reference beam to a combined beam of said combined beams.

12. Interferometer module according to claim 11, wherein said beam splitter unit comprises a single beam splitter for splitting said three beams into three measurement beam/reference beam pairs.

13. Interferometer module according to claim 11 or claim 12, wherein said beam detectors each comprise a beam intensity detector or a beam energy detector for detecting an intensity or energy of a corresponding combined beam.

14. Interferometer module according to claim 11, wherein the beam splitter unit is adapted for emitting said three measurement beams non-coplanarly, and/or for emitting said three reference beams non-coplanarly.

15. Interferometer module according to claim 11, further comprising a beam path separator arranged between said beam splitter unit and said mirrors, and arranged for directing said three measurement beams.

16. Interferometer module according to claim 15, wherein a first incident measurement beam and a second incident measurement beam span a first plane and the second incident measurement beam and a third incident measurement beam span a second plane at an angle $\alpha$ to the first plane, and a first incident reference beam and a second incident reference beam span a third plane and the second incident reference beam and a third incident reference beam span a fourth plane at substantially the same angle $\alpha$ to said third plane.

17. Interferometer module according to claim 16, wherein said angle $\alpha$ is 90°.

18. Interferometer module according to claim 17, wherein the second plane and the fourth plane substantially coincide.

19. Interferometer module to claim 11, wherein the three incident measurement beams are substantially parallel to each other and/or wherein the three incident reference beams are substantially parallel to each other.

20. Interferometer module according to claim 11, wherein each of said three incident measurement beams is substantially parallel to its associated incident reference beam.

21. Interferometer module according to claim 11, wherein said first and second mirror are spaced apart from said module.

22. Interferometer module according to claim 11, wherein the inside of said module is substantially filled with a solid material, preferably a cured epoxy-resin, more preferably Stycast®.

23. Interferometer module according to claim 11, wherein the beam splitter and the beam combiner are comprised in a single integrated unit.

24. Lithography system comprising an interferometer module according to claim 1, said system further comprising,
an optical column for projecting a pattern onto a target,
a target carrier for moving said target relative to the optical column,
a controller, for controlling movement of said target carrier relative to the optical column,
wherein the target carrier is provided with a first mirror, and wherein the optical column is provided with a second mirror,
wherein said interferometer is arranged for emitting said measurement beam on said first mirror and said reference beam on said second mirror,
wherein said controller is adapted for controlling movement of said target carrier relative to said optical column based on the energies of beams detected by said first, second, third and fourth detectors.

25. Method of determining a displacement of a measurement mirror relative to a reference mirror using an interferometer module adapted for emitting a measurement beam and an associated reference beam towards a respective measurement mirror and reference mirror, said interferometer module comprising:
a beam combiner for combining a reflection of said measurement beam and said reference beam into a combined beam,
a non-polarizing beam splitter for splitting said combined beam into a first split beam and a second split beam, each split beam comprising a component of said reference beam and said measurement beam,
a first polarizing beam splitter, for splitting said first split beam into a first polarized beam having a first polarization and a second polarized beam having a second polarization,
a second polarizing beam splitter, for splitting said second split beam into a third polarized beam having a third polarization and a fourth polarized beam having a fourth polarization,
a first, second, third and fourth detector for detecting a beam energy of said first, second, third and fourth polarized beams respectively,
wherein said polarizations of said first, second, third and fourth polarized beams are different polarizations, said method comprising the steps of:
measuring the energies of said first, second, third and fourth polarized beams at said first, second, third and fourth detector respectively,
providing a first displacement signal as a difference between said first and second measured energy, and providing a second displacement signal as a difference between said third and fourth measured energy.

* * * * *